United States Patent [19]
Ben-Michael et al.

[11] Patent Number: 5,793,789
[45] Date of Patent: Aug. 11, 1998

[54] DETECTOR FOR PHOTONIC INTEGRATED TRANSCEIVERS

[75] Inventors: Rafael Ben-Michael, Scotch Plains; Uziel Koren, Fairhaven, both of N.J.

[73] Assignee: Lucent Technologies Inc., Murray Hill, N.J.

[21] Appl. No.: 700,245

[22] Filed: Aug. 20, 1996

[51] Int. Cl.[6] ............................................ H01S 3/19
[52] U.S. Cl. ................................ 372/50; 372/45
[58] Field of Search ........................... 372/50, 45

[56] References Cited

U.S. PATENT DOCUMENTS

| 5,031,188 | 7/1991 | Koch et al. | 372/50 |
|---|---|---|---|
| 5,144,637 | 9/1992 | Koch et al. | 372/50 |

OTHER PUBLICATIONS

"Optical Module with a Silica–Based Planar Lightwave Circuit for Fiber–Optic Subscribers Systems," by H. Terui et al., IEEE Photonics Technology Letters, vol. 4, No. 6, Jun. 1992, pp. 660–662.

"A Hybrid Integrated Optical WDM Transmitter/Receiver Module for Optical Subscriber Systems Utilizing a Planar Lightwave Circuit Platform," by Y. Yamada et al., OFC '95 Optical Fiber Communication, Postdeadline Papers, Optical Society of America, IEEE, Feb. 26–Mar. 3, 1995, 6 pages.

"Properties of Commercial 1.3–μm Fabry–Perot Laser Modules in a Time Compression Multiplexing System", by Norio Kashima, 1991 IEEE, Journal of Lightwave Technology, vol. 9, No. 7, Jul. 1991, pp. 918–923.

"Photodetection Properties of Semiconductor Laser Diode Detectors", by Arne Alping, Robert Tell, and Sverre T. Eng, 1986 IEEE, Journal of Lightwave Technology, vol. LT–4, No. 11, Nov. 1986, pp. 1662–1668.

"Dynamic properties of 1.3 μm semi—insulating–BH light—emission–and–detection (LEAD)—diode module for subscriber TCM transmission systems", by T. Kurosaki, Y. Tohmori, M. Fukuda, M. Nakamura, H. Kimura, S. Matsumoto and T. Sugie, Electronics Letters, 2nd Feb. 1995, vol. 31, No. 3, pp. 189–191.

"Highly reliable 1.55 μm GaInAsP laser diodes buried with semi–insulating iron–doped InP", by S. Matsumoto, M. Fukuda, K. Sato, Y. Itaya and M. Yamamoto, Electronics Letters, 4th Aug. 1994, vol. 30, No. 16, pp. 1305–1306.

(List continued on next page.)

*Primary Examiner*—James W. Davie

[57] ABSTRACT

An integrated light-emitting device has a laser section and a detector section. The laser section and the detector section have an active layer that is integrated along an in-line waveguide. The detector section also has a bulk layer adjacent to the active layer, where the bulk layer has a band gap energy lower than the band gap energy of the active layer. In one embodiment, the active layer is an multiple quantum well (MQW) layer, the waveguide has two quaternary layers, and the bulk layer is a bulk quaternary layer. The device, which has uncooled modes of operation for both transmitting and receiving, may be used as a transceiver in a ping-pong optical data link configuration. The device may also have a beam expander section, with the laser, detector, and beam expander sections inside a Fabry-Perot cavity, along the single in-line waveguide. In one embodiment having a 1.3 μm lasing wavelength, the addition of a 1.4 μm bulk quaternary layer provides the detector with a broad spectral responsivity range extending 33 nm higher than the lasing wavelength of the device. This permits uncooled operation of the device with sufficient response even in the most severe temperature scenarios that would typically occur. The transmitter can provide 8 dBm inside a single mode fiber, and the beam expander relaxes the alignment tolerance, using a cleaved rather than a lensed single mode fiber.

22 Claims, 4 Drawing Sheets

OTHER PUBLICATIONS

"1.3 µm light–emission–and–detection (LEAD) diodes with semi–insulating buried heterostructure", by Y. Tohmori, M. Fukuda, S. Matsumoto, T. Kurosaki, M. Yamamoto, Y. Itaya, T. Sugie and H. Tsuchiya, Electronics Letters, 1st Sep. 1994, vol. 30, No. 18, pp. 1518–1519.

"High Responsivity 1.3 µm Transceiver Module for Low Cost Optical Half–Duplex Transmission", by J. Semo, H. Nakajima, C. Kazmierski, N. Kalonji, J. Landreau and B. Pierre, Electronics Letters, 1st Apr. 1993, vol. 29, No. 7, pp. 611–612.

"Polarisation insensitive photodetector characteristics of a tensile strained barrier laser diode", by Y. Suzuki, T. Kurosaki, Y. Tohmori and Fukuda, Electronics Letters, 3rd Feb. 1994, vol. 30, No. 3, pp. 230–232.

"7.5 km Bidirectional Single–Mode Optical–Fibre Link Using Dual–Mode InGaAsP/InP 1.3 µm Laser Detectors", by J.P. Van Der Ziel, R.M. Mikulyak, and R.A. Logan, Electronics Letters, 23rd May 1985, vol. 21, No. 11, pp. 511–512.

DETECTOR FOR PHOTONIC INTEGRATED TRANSCEIVERS

BACKGROUND OF THE INVENTION

1. Field of the Invention

The present invention relates to integrated light emitting devices, and, in particular, to photonic integrated transceivers used as fiber optical data links.

2. Description of the Related Art

In data communication based on fiber optics, it is desirable, for deployment of a single mode fiber to the home, to develop an inexpensive optical data link. In order to reduce the cost of a local-loop communication system operating at 1.3 μm wavelength, transmitters and receivers in such a system should operate in an uncooled mode of operation. To further reduce the cost, the transmitters could be Fabry-Perot cavity lasers with a relatively broad spectral range of ±10 nm around the desired 1.3 μm lasing wavelength.

Uncooled operation means that different transmitters (and receivers) in the system may be operating at different temperatures. Since the lasing wavelength of a transmitter is affected by temperature, different transmitters in the system may be transmitting at slightly different lasing wavelengths. In order for the system to operate efficiently, the receivers should have broad spectral responsivity around the lasing wavelength. Assuming worst case scenarios in temperature variations, and a temperature affect on lasing wavelength of approximately 6 Å/° C., the receivers should have a responsivity of about ±35 nm around the lasing wavelength.

One proposed configuration is a ping-pong link, where transmitting and receiving occurs through a single fiber at different time slots with time division multiplexing (TDM). A proposed solution for a transceiver operating in such a system would be to use a bulk laser, which operate part of the time as a detector. For further details, see H. Terui et al., "Optical module with a silica-based planar circuit for fiber-optic subscriber systems," Phot. Tech. Lett., vol. 4, pp. 660–662 (1992) and S. L. Woodward et al., "A full duplex optical data link using lasers as transceivers," Phot. Tech. Lett., vol. 7, pp. 1060–1062, Sep. 19, 1995. The use of a laser as a transceiver provides certain advantages. First of all, relatively inexpensive uncooled lasers are commercially available. In addition, using a laser as a receiver eliminates the need for a separate receiver, located either on a separate fiber or after an optical splitter. By using a bulk laser, instead of a multiple quantum well (MQW) laser, polarization independent detection would be possible.

The problem with the proposed solution is that the responsivity, even of a bulk laser, is not broad enough to account for the extremely broad spectral responsivity range needed in a low-cost (i.e., uncooled) configuration. An object of the present invention is to provide a configuration that has the advantages but not the disadvantages of the previously proposed configuration.

Further objects and advantages of this invention will become apparent from the detailed description which follows.

SUMMARY OF THE INVENTION

The present invention is an integrated light-emitting device, comprising a laser section and a detector section. The laser section and the detector section comprise an active layer that is integrated along an in-line waveguide. The detector section further comprises a bulk layer adjacent to the active layer, where the bulk layer has a band gap energy lower than the band gap energy of the active layer.

In an alternative embodiment, the laser section and the detector section of the integrated light-emitting device comprise a multiple quantum well (MQW) layer that is integrated along an in-line waveguide comprising two quaternary layers. The detector section further comprises a bulk quaternary layer, where the bulk layer has a band gap energy lower than a band gap energy of the MQW layer.

BRIEF DESCRIPTION OF THE DRAWINGS

Other objects, features, and advantages of the present invention will become more fully apparent from the following detailed description, the appended claims, and the accompanying drawings in which:

DETAILED DESCRIPTION

The present invention is directed to an integrated light-emitting transceiver operating, for example, in the 1.3 μm wavelength range. The transceiver has a sufficiently broad spectral responsivity range when operated in an uncooled configuration to allow it to be used in low-cost local-loop applications.

Figure 1:
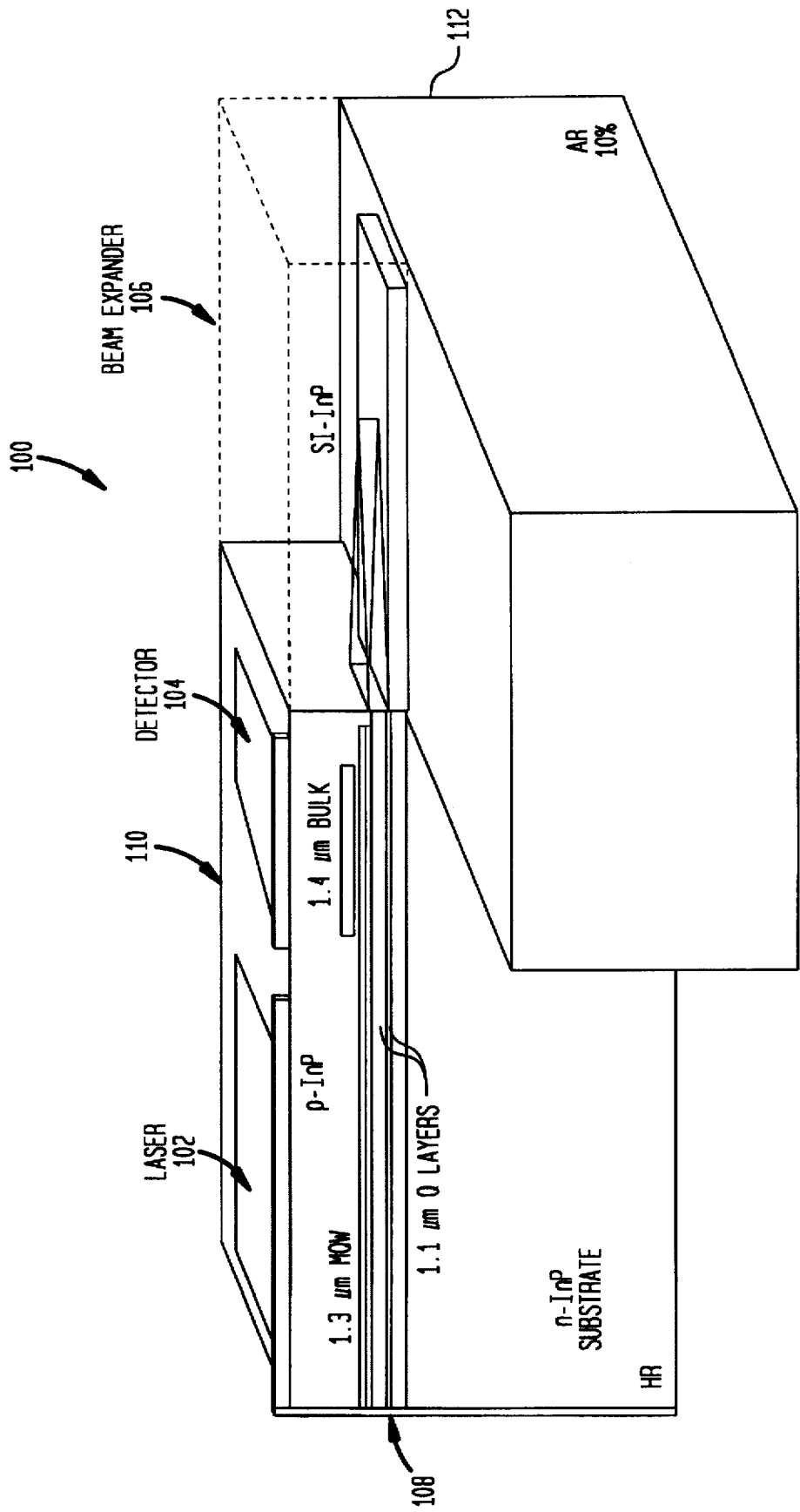
FIG. 1 is a schematic structure of a photonic integrated transceiver, according to one embodiment of the present invention.

Referring now to FIG. 1, there is shown a schematic structure of transceiver 100, according to one embodiment of the present invention. Transceiver 100, which operates in the 1.3 μm wavelength range, is a single in-line waveguide device with integration of a gain section (laser), a detector, and a beam expander. All three sections are integrated inside the Fabry-Perot cavity of the laser, along an underlying waveguide.

The detector has a 1.4 μm bulk quaternary layer to achieve a broad spectral responsivity range. The gain and detector sections are optimized by making use of the high gain provided by a multiple quantum well layer together with the benefit of the polarization-independent response of the bulk layer in the detector section. Transceiver 100 has insignificant degradation of performance when operating as a laser.

The purpose of the beam expander is to reduce the cost of packaging transceiver 100. With a beam expander, there is no need for a lensed fiber, because good coupling is achieved to a cleaved (flat) single mode fiber. For further details, see R. Ben-Michael et al., "InP-based multiple quantum well lasers with an integrated tapered beam expander waveguide," IEEE Phot. Tech. Lett., vol. 16, pp. 1412–1414 (1994) and U. Koren et al., "Electroabsorption modulator with passive waveguide spotsize converters," Electron.

Lett., vol. 30, pp. 1852–1853 (1994), both of which are incorporated herein by reference. Moreover, alignment tolerance of the cleaved fiber to the output of the beam expander is significantly enhanced, suggesting possible use with a passive alignment or hybrid integration scheme, that could further reduce the cost of packaging transceiver 100. For further details, see Y. Yamada et al., "A hybrid integrated optical WDM transmitter receiver module for optical subscriber systems utilizing a planar lightwave circuit platform," Post Deadline Proc. Opt. Fiber Commun. Conf. (OFC'95), San Diego, Calif., February 1995, paper PD-16 and Y. Yamada, "Silica based optical waveguide on terraced silicon substrate as hybrid integration platform," Electron. Lett., vol. 29, pp. 444–446 (1993), both of which are incorporated herein by reference.

Design and Fabrication

Referring again to FIG. 1, transceiver 100 comprises three sections: laser 102, detector 104, and beam expander 106, integrated along underlying backbone waveguide 108. Waveguide 108 has two InGaAsP quaternary layers, with band gap $\lambda_g=~1.1$ µm (~1.1 Q), separated by an InP etch stop separation layer. The bottom waveguiding layer is ~800 Å thick and the top waveguiding layer is ~1400 Å thick.

The gain section of transceiver 100 is also referred to as the laser section. Laser 102 has a multiple quantum well layer comprising six compressively strained (~0.9%)–70 Å thick quantum wells separated by ~150 Å–1.1 Q tensile strained barriers. It will be understood that alternative embodiments of the present invention may have different numbers of quantum well and/or different straining or even no straining. The length of the laser section is ~500 µm.

Detector 104 is electrically separated from laser 102. The detector section has the same underlying MQW layer as the laser section plus an ~800 Å–1.4 Q bulk layer. In order to reduce the capacitance of detector 104, the length of the detector section (~85 µm) is shorter than that of the laser section. The detector ohmic contact stripe is ~10 µm wide, connected with a (~100 µm×~100 µm) contact pad on top of a ~0.5 µm thick $SiO_2$ layer. The resulting zero bias capacitance of the detector section is approximately 2 pF. This value can probably be reduced by using polyimide pads.

In beam expander section 106, the top ~1.1 Q layer is adiabatically tapered laterally from ~3 µm at the beginning of the beam expander (i.e., the end adjacent to detector 104) to a sharp termination. The bottom layer remains in the same ~5 µm width along the entire ~300 µm long beam expander. The beam expander transforms the elliptical optical mode both laterally and vertically to fit better the shape of the optical mode in a single mode fiber.

Transceiver 100 may be grown in four epitaxial growth steps by metal organic chemical vapor phase epitaxy (MOVPE). First the waveguide layers, the MQW layer, and the bulk ($\lambda_g=~1.4$ µm) InGaAsP layer are grown. Stripes ~85 µm wide are formed from the ~1.4 Q layer by selective etching. The passive beam expander section is defined by removing the MQW layer from that section. Then additional Zn-doped p InP is grown. Next, the p InP is removed from the passive beam expander section, and $SiO_2$ stripes are formed. Next, the tapered beam expander waveguide is formed. The following steps are the same as in a standard semi-insulating InP buried heterostructure process. For further details, see U. Koren et al., "Semi-insulating blocked planar buried heterostructure GaInAs-InP laser with high power and high modulation bandwidth," Electron. Lett., vol. 24, pp. 138–139 (1988), which is incorporated herein by reference. Electrical isolation is formed by ~20 µm separation between the laser and the detector contacts, and by ion implantation in the separation region (110). This results in approximately 100 kΩ resistance between the two pads. Transceiver 100 is then mounted on a ceramic heat sink with three different contacts, for ground, laser, and detector.

Mode of Operation

Figure 2:
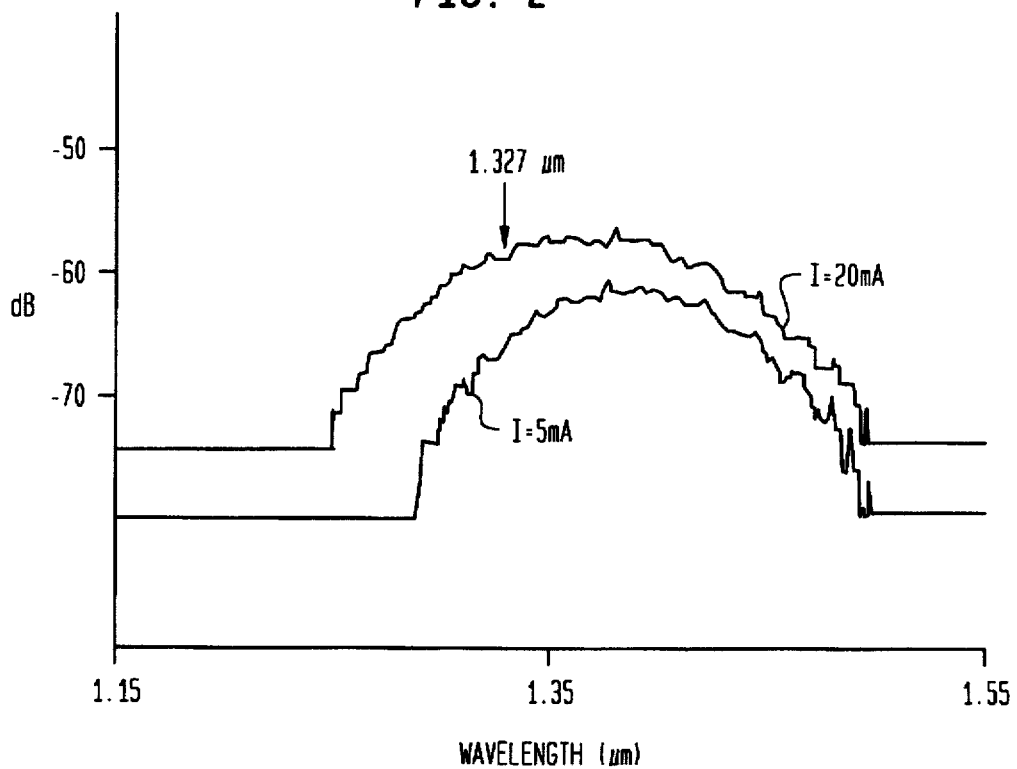
FIG. 2 shows the electro-luminescence of the detector section of the transceiver of FIG. 1, when the laser section is zero biased, at two different pump currents.

Transceiver 100 operates either as a transmitter or as a receiver. When operated as a transmitter, the detector section may be absorbing, if no current is applied to that section. When the detector section is driven with a low forward current, low emission appears in the lasing wavelength. When the drive current in that section is increased, the emission curve broadens, and significantly reduces the loss in the lasing wavelength, which is determined by the longer gain section (i.e., the laser section). This is demonstrated in FIG. 2, which shows the electro-luminescence of the detector section, when the laser section is zero biased, at two different pump currents. As shown in FIG. 2, at a low forward drive current (e.g., 5 mA), there is little emission in the lasing wavelength ($\lambda=1.327$ µm for transceiver 100). At a higher drive current (e.g., 20 mA), however, the electro-luminescence broadens, and the loss in the lasing wavelength is significantly reduced. In order to reduce shot noise, the detector section can operate at zero bias, when transceiver 100 is used as a receiver.

Figure 3:
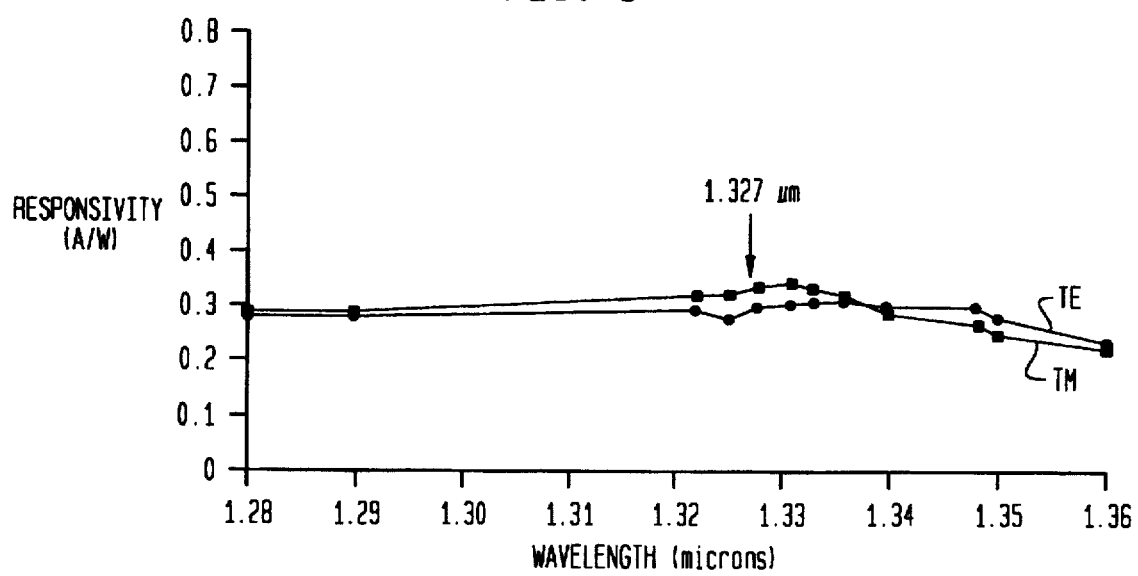
FIG. 3 shows the responsivity of the transceiver of FIG. 1 for wavelengths ranging from 1.28 to 1.36 μm.
Figure 4:
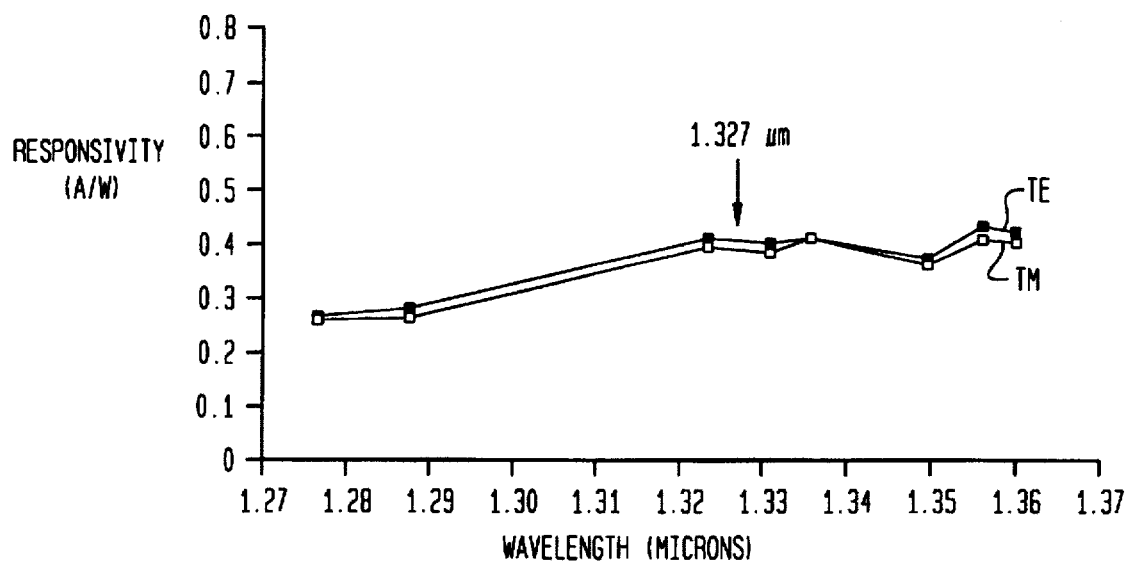
FIG. 4 shows the responsivity of the transceiver of FIG. 1 with an AR coating for wavelengths ranging from 1.28 to 1.36 μm.

FIGS. 3 and 4 show experimental results that were achieved with zero biasing the detector. The responsivity of the detector was measured using four different Fabry-Perot lasers that were temperature tuned for different wavelength. The output of these lasers was coupled to a single mode fiber and a polarization controller, and the light coming out of the cleaved fiber was inserted into the transceiver. The response of the detector was measured while the transceiver was at room temperature. The front facets of the transceiver and the fiber were as cleaved (i.e., with no anti-reflecting coating).

In FIG. 3, the responsivity of transceiver 100 is shown for wavelengths ranging from 1.28 to 1.36 µm, for both transverse electrical (TE) and transverse magnetic (TM) polarized light. The laser section could be either grounded or floating, with no effect on the receiver responsivity. The responsivity at the lasing wavelength of transceiver 100 (i.e., 1.327 µm) is ~0.33 amps/watt (A/W). The receiver has a flat response with less that −1 dB variation over the entire measured spectral range of 80 nm. The polarization sensitivity is smaller than 0.5 dB.

In order to improve the responsivity of the receiver, the front facet of transceiver 100 (112 in FIG. 1) may be coated with an anti-reflecting (AR) coating. FIG. 4 shows the responsivity of transceiver 100 with an AR coating, for both TE and TM polarized light. The highest responsivity is increased to ~0.43 A/W, with very low polarization sensitivity. The extremely broad spectral responsivity range and the polarization independence achieved in both cases (i.e., FIGS. 3 and 4) may be attributed to the structure of the detector section, which includes a bulk ~1.4 Q layer. This spectral responsivity may meet the demand for broad spectral responsivity range in a low-cost network configuration, with a measured range of 33 nm above and 47 nm below the lasing wavelength.

To operate transceiver 100 as a transmitter, three schemes of operation exist. A first transmitter operation scheme is to drive just the laser section, without any bias on the detector section. In this scheme, lasing occurs at a high threshold current of about 100 mA.

A second operation scheme is to connect the laser and the detector sections, and drive them simultaneously. This will yield a threshold current of approximately 65 mA.

Figure 5:
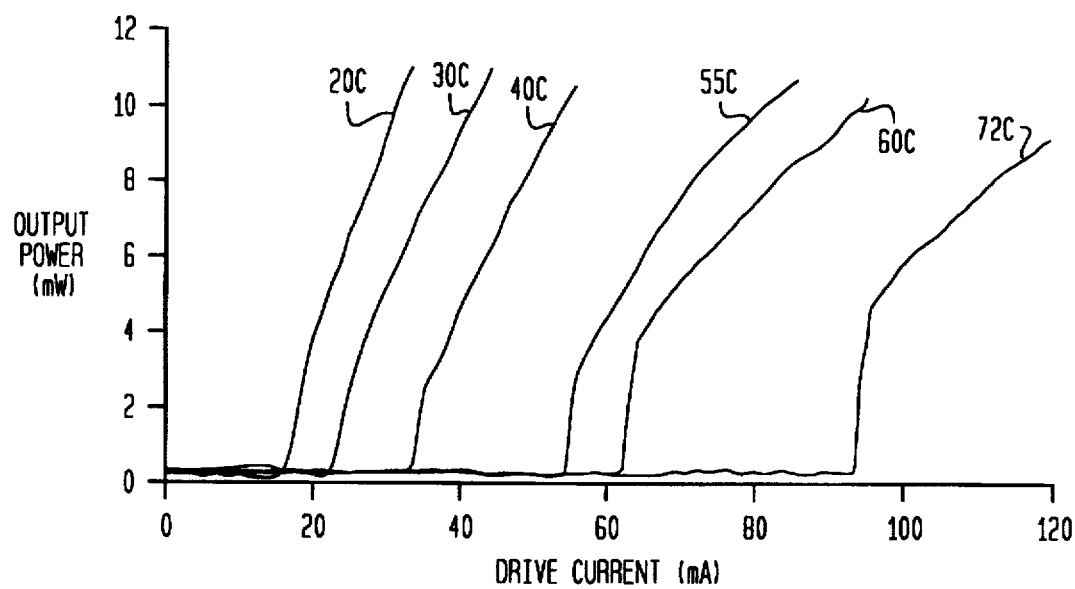
FIG. 5 shows the output power coming out of the front facet of the transceiver of FIG. 1 vs. the drive current at different temperatures.

A third operation scheme is to drive the detector section at a constant current that is higher than 30 mA, in which case, the room temperature threshold current of the laser section is ~18 mA. FIG. 5 shows the output power coming out of front facet 112 of transceiver 100 vs. the drive current at different temperatures. The detector was biased at ~50 mA in this measurement. As indicated in FIG. 5, lasing up to 72° C. is demonstrated with output power of ~9 mW, and with characteristic temperature of the laser of $T_0 = 31°$ C.

Figure 6:
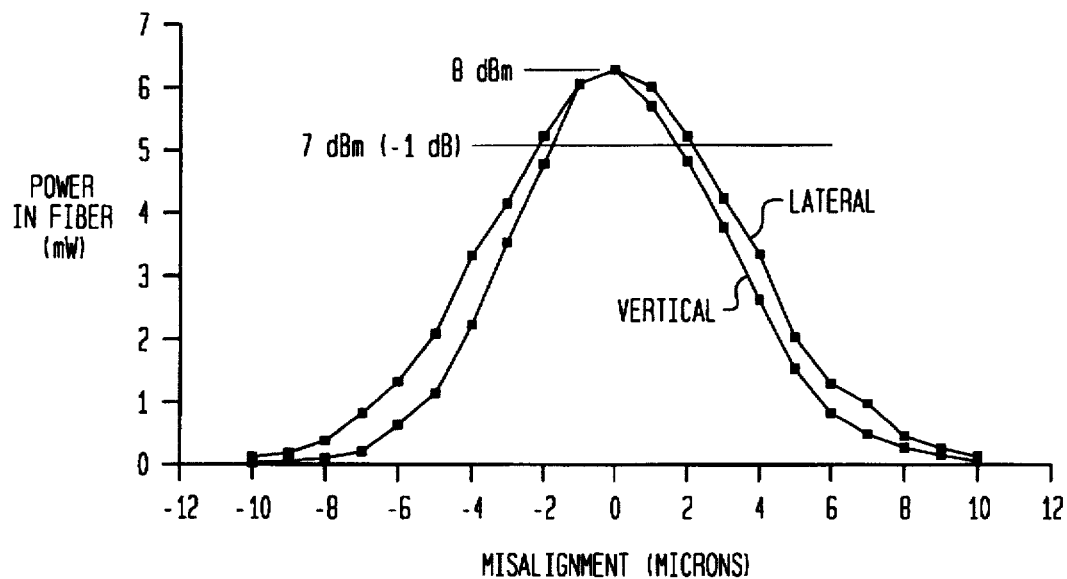
FIGS. 6 and 7 show the alignment tolerance of the transceiver of FIG. 1 to a single mode fiber, when operated either as a receiver or as a transmitter.
Figure 7:
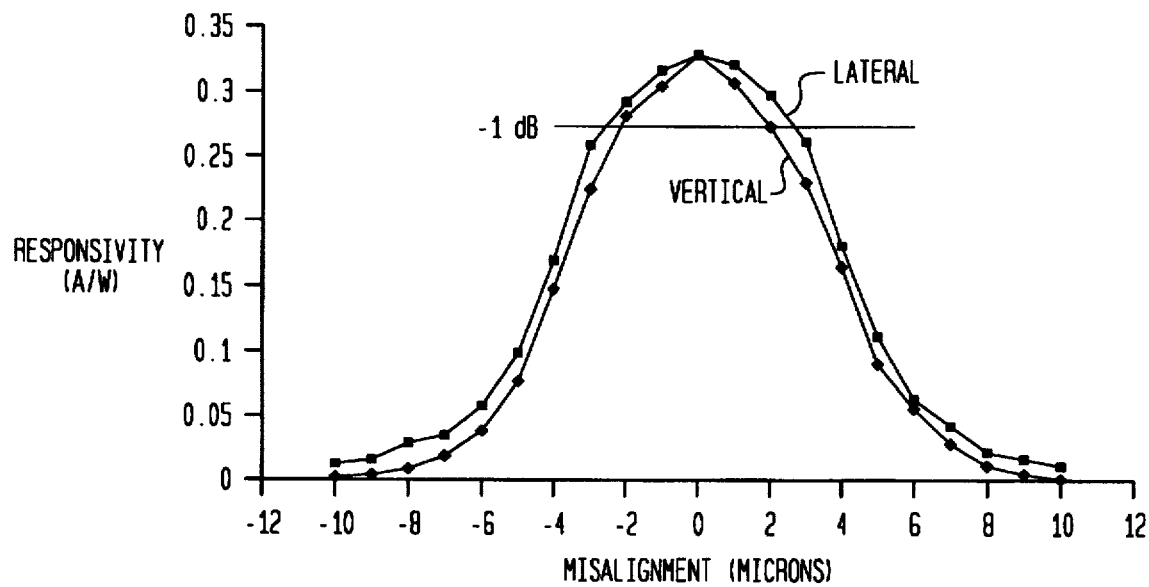

Typical insertion loss to a single mode optical fiber is −3.9 dB (41%), and at room temperature, typically 8 dBm is coupled to a single mode fiber, with drive current of ~100 mA in the laser section and drive current of ~50 mA in the detector section. By adding the beam expander, the alignment tolerance for coupling transceiver 100 and a single mode fiber is greatly enhanced. FIGS. 6 and 7 show the alignment tolerance of transceiver 100 to a single mode fiber, when operated either as a receiver or as a transmitter. FIG. 6 shows the power coupled to a cleaved single mode fiber vs. lateral and vertical misalignments, with the conditions stated above, giving 8 dBm inside the fiber with optimal alignment. The fiber was translated laterally and vertically and the power in the fiber was measured at each step.

FIG. 7 shows the responsivity of the detector with optimal alignment and with lateral and vertical displacements. As shown in FIG. 7, the 1-dB excess loss due to misaligning the fiber both when transceiver 100 is operating as a receiver or a transmitter is ±2.2 μm vertically and ±3.2 μm laterally. These results can possibly allow for reduction of "pigtailing" cost of transceiver 100 due to the more relaxed alignment needed, together with the use of a cleaved single mode fiber.

Those skilled in the art will understand that transceiver 100 is a potentially low-cost photonic integrated light-emitting that can operate as a transceiver in a ping-pong optical data link configuration. Transceiver 100 is designed for uncooled operation, with integration of a laser, a detector, and a beam expander inside a Fabry-Perot cavity, along a single in-line waveguide. The detector has a broad spectral responsivity range of 80 nm, extending to 33 nm above the lasing wavelength of the device. This may allow for sufficient response even in the most severe temperature scenario that might occur in a network. The transmitter can couple 8 dBm of optical power into a single mode fiber, using a beam expander which provides the benefits of relaxed alignment tolerance, and the use of a cleaved rather than a lensed single mode fiber.

The addition of a bulk layer to the detector section provides the present invention with certain advantages over other laser-based transceivers. Because the band gap energy of the bulk layer is designed to be less than the band gap energy of the active (MQW) layer, devices of the present invention are able to absorb light with wavelengths longer than the lasing wavelength of the active layer. Thus, the bulk layer increases the range of absorption of the detector section, thereby enabling the device to operate efficiently as a receiver at a relatively wide range of temperatures. This makes the devices of the present invention suitable for use as transceivers in uncooled modes of operation.

The devices of the present invention provide the advantages of both MQW layers and bulk layers. MQW layers operate well as transmitters, but less well as receivers because their response is typically dependent on the polarization of the incoming light. Bulk layers, on the other hand, are relatively insensitive to polarization and therefore work well as receivers. By integrating an MQW layer and a bulk layer into a single transceiver, devices of the present invention take advantage of the good transmitting capabilities of MQW layers as well as the good receiving capabilities of bulk layers.

Alternative Embodiments

Those skilled in the art will understand that transceiver 100 of FIG. 1 is just one embodiment of the present invention and that many other embodiments are also possible. It will be understood that these other embodiments may differ from transceiver 100 in one or more of its particular characteristics. Essential characteristics of the present invention are that the transceiver has a laser section and a detector section, both of which have an active layer that is integrated along an in-line waveguide. (Those skilled in the art will understand that an active layer is a lasing layer that has a band gap energy corresponding to its lasing wavelength.) The detector section also has a bulk layer adjacent to the active layer, where the bulk layer has a band gap energy that is lower than the band gap energy of the active layer. Almost every other characteristic of transceiver 100 is subject to change based on implementation requirements and/or design choices.

For example, depending upon the implementation, the term "adjacent" can have different meanings. For example, in a transceiver having an MQW active layer and two quaternary waveguide layers, the bulk layer of the detector section being adjacent to the active layer could mean that the bulk layer is on top of the MQW layer which is itself on top of the two waveguide layers, as in transceiver 100 of FIG. 1. Alternatively, the bulk layer could be between the MQW layer and the waveguide layers, or even between the waveguide layers, and the MQW layer could be under or even between the waveguide layers. It will also be understood that the waveguide may be implemented with other than two quaternary layers.

Transceiver 100 was designed to operate with a lasing wavelength of 1.3 μm and many of the band gaps, material compositions, and dimensions were selected to achieve that lasing wavelength. It will be understood that other transceivers of the present invention may be designed with different characteristics to operate at different lasing wavelengths.

For example, in transceiver 100, the waveguide layers and the bulk layer are made of InGaAsP, a particular quaternary material. In alternative embodiments, other materials, such as other quaternary materials, ternary materials, or any other suitable material, may be used. The same is true for the composition of other layers of devices of the present invention.

In transceiver 100, the active lasing layer is a multiple quantum well layer consisting of six quantum wells separated by barriers. In other embodiments, the active layer may have different compositions, including different numbers of quantum wells. In fact, the active layer need not even be an MQW layer. Any other active lasing layer may be suitable, including bulk lasers.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated light-emitting device, comprising:
   (a) a laser section; and (b) a detector section, wherein:
the laser section and the detector section comprise an active layer integrated along an in-line waveguide;
the detector section comprises a bulk layer adjacent to the active layer; and
the bulk layer has a band gap energy lower than the band gap energy of the active layer.

2. The invention of claim 1, wherein the waveguide comprises two or more quaternary or multiple quantum well (MQW) layers separated by one or more separation layers.

3. The invention of claim 1, wherein the active layer comprises a multiple quantum well layer comprising a plurality of quantum wells separated by barriers.

4. The invention of claim 3, wherein the quantum wells are compressively strained and the barriers are tensile strained.

5. The invention of claim 1, wherein the bulk layer is a bulk quaternary layer.

6. The invention of claim 1, wherein the device has a transmitting mode of operation and a receiving mode of operation.

7. The invention of claim 6, wherein both the transmitting mode of operation and the receiving mode of operation are uncooled modes of operation.

8. The invention of claim 1, wherein the length of the detector section is smaller than the length of the laser section.

9. The invention of claim 1, further comprising a beam expander section adjacent to the detector section, wherein the detector section and the beam expander section are integrated along the waveguide.

10. The invention of claim 9, wherein the beam expander section comprises two quaternary layers.

11. The invention of claim 10, wherein, in the beam expander section, one of the two quaternary layers is tapered to a sharp termination and the beam expander transforms an elliptical optical mode both laterally and vertically.

12. The invention of claim 1, wherein the laser section and the detector section are integrated within a Fabry-Perot cavity.

13. The invention of claim 1, wherein the detector section has a spectral responsivity range of at least ±35 nm around a lasing wavelength of the laser section.

14. The invention of claim 1, wherein:
the active layer has a band gap energy corresponding to approximately 1.3 µm; and
the bulk layer has a band gap energy corresponding to approximately 1.4 µm.

15. The invention of claim 1, wherein the detector section is electrically separated from the laser section.

16. The invention of claims 1, wherein a front facet of the integrated light-emitting device has an anti-reflecting coating.

17. The invention of claim 1, wherein:
the waveguide comprises two or more quaternary layers separated by one or more separation layers;
the active layer comprises a plurality of quantum wells separated by barriers;
the bulk layer is a bulk quaternary layer;
the device has a transmitting mode of operation and a receiving mode of operation that are both uncooled modes of operation;
the length of the detector section is smaller than the length of the laser section;
the laser section and the detector section are integrated within a Fabry-Perot cavity;
the detector section is electrically separated from the laser section.

18. The invention of claim 17, further comprising a beam expander section adjacent to the detector section, wherein:
the detector section and the beam expander section are integrated along the waveguide;
the beam expander section comprises the two quaternary layers;
in the beam expander section, one of the two quaternary layers is tapered to a sharp termination and the beam expander transforms an elliptical optical mode both laterally and vertically.

19. The invention of claim 17, wherein:
the quantum wells are compressively strained and the barriers are tensile strained;
the detector section has a spectral responsivity range of at least ±35 nm around a lasing wavelength of the laser section;
the waveguide layer has a band gap energy corresponding to approximately 1.1 µm;
the active layer has a band gap energy corresponding to approximately 1.3 µm;
the bulk layer has a band gap energy corresponding to approximately 1.4 µm; and
a front facet of the integrated light-emitting device has an anti-reflecting coating.

20. An integrated light-emitting device, comprising:
(a) a laser section; and
(b) a detector section, wherein:
the laser section and the detector section comprise an MQW layer that is integrated along an in-line waveguide comprising two quaternary layers;
the detector section further comprises a bulk quaternary layer adjacent to the MQW layer; and
the bulk layer has a band gap energy lower than a band gap energy of the MQW layer.

21. The invention of claim 20, further comprising a beam expander section integrated along the waveguide adjacent to the detector section, wherein:
the beam expander section also comprises the two quaternary layers;
in the beam expander section, one of the two quaternary layer is tapered to a sharp termination;
the beam expander transforms an elliptical optical mode both laterally and vertically;
the laser section, the detector section, and the beam expander section are integrated within a Fabry-Perot cavity;
the device has a transmitting mode of operation and a receiving mode of operation that are both uncooled modes of operation;
the MQW layer comprises a plurality of quantum wells separated by barriers; and the detector section is electrically separated from the laser section.

22. The invention of claim 21, wherein:
the two quaternary layers are InGaAsP layers separated by an InP separation layer;
the two quaternary layers have a band gap energy corresponding to approximately 1.1 µm;
one of the two quaternary layers is approximately 800 Å thick and another of the two quaternary layers is approximately 1400 Å thick;
the plurality of quantum well layers comprise six quantum wells;

the quantum wells are compressively strained and the barriers are tensile strained;

each quantum well is approximately 70 Å thick and each barrier is each approximately 150 Å thick;

each barrier has a band gap energy corresponding to approximately 1.1 µm;

the laser section has a length of approximately 500 µm and a width of approximately 5 µm;

the laser section has a lasing wavelength of approximately 1.3 µm;

the detector section has a length of approximately 85 µm and a width of approximately 5 µm;

the detector section has a spectral responsivity range of at least ±35 nm around a lasing wavelength of the laser section;

the bulk quaternary layer is approximately 800 Å thick;

the bulk quaternary layer has a band gap energy corresponding to approximately 1.4 µm;

the beam expander has a length of approximately 300 µm and a width of approximately 5 µm; and a front facet of the integrated light-emitting device has an anti-reflecting coating.

* * * * *